US009466459B2

(12) United States Patent
Gardiner et al.

(10) Patent No.: US 9,466,459 B2
(45) Date of Patent: Oct. 11, 2016

(54) METHOD FOR OPTIMIZING FLUID FLOW ACROSS A SAMPLE WITHIN AN ELECTRON MICROSCOPE SAMPLE HOLDER

(71) Applicant: PROTOCHIPS, INC., Morrisville, NC (US)

(72) Inventors: Daniel Stephen Gardiner, Wake Forest, NC (US); Franklin Stampley Walden, II, Raleigh, NC (US); John Damiano, Jr., Apex, NC (US)

(73) Assignee: PROTOCHIPS, INC., Morrisville, NC (US)

( * ) Notice: Subject to any disclaimer, the term of this patent is extended or adjusted under 35 U.S.C. 154(b) by 0 days.

(21) Appl. No.: 14/729,547

(22) Filed: Jun. 3, 2015

(65) Prior Publication Data

US 2015/0348745 A1    Dec. 3, 2015

Related U.S. Application Data

(60) Provisional application No. 62/007,162, filed on Jun. 3, 2014.

(51) Int. Cl.
| | |
|---|---|
| *H01J 37/20* | (2006.01) |
| *F16J 15/02* | (2006.01) |
| *F16J 15/06* | (2006.01) |
| *F16J 15/10* | (2006.01) |
| *B01L 9/00* | (2006.01) |

(52) U.S. Cl.
CPC ............... *H01J 37/20* (2013.01); *B01L 9/52* (2013.01); *F16J 15/022* (2013.01); *F16J 15/062* (2013.01); *F16J 15/064* (2013.01); *F16J 15/104* (2013.01); *B01L 2200/0636* (2013.01); *H01J 2237/2003* (2013.01); *H01J 2237/2006* (2013.01); *H01J 2237/2007* (2013.01)

(58) Field of Classification Search
CPC .. H01J 37/20; H01J 37/26; H01J 2237/2003; H01J 2237/2004; H01J 2237/2005; H01J 2237/2006; H01J 2237/2007; F16J 15/02; F16J 15/021; F16J 15/022; F16J 15/10; F16J 15/104; F16J 15/062; F16J 15/064; B01L 9/52; B01L 2200/0636
See application file for complete search history.

(56) References Cited

U.S. PATENT DOCUMENTS

| | | | |
|---|---|---|---|
| 5,716,051 A * | 2/1998 | Cornea ................. | F16J 15/061 277/609 |
| 7,713,053 B2 | 5/2010 | Mick et al. | |
| 8,466,432 B2 | 6/2013 | Damiano, Jr. et al. | |
| 8,513,621 B2 | 8/2013 | Nackashi et al. | |
| 8,829,469 B2 | 9/2014 | Damiano, Jr. et al. | |
| 8,872,129 B2 | 10/2014 | Damiano, Jr. et al. | |
| 8,920,723 B2 | 12/2014 | Damiano, Jr. et al. | |
| 9,040,939 B2 | 5/2015 | Damiano, Jr. et al. | |
| 9,048,065 B2 | 6/2015 | Damiano et al. | |
| 9,064,672 B2 | 6/2015 | Mick et al. | |
| 9,349,621 B2 * | 5/2016 | Singh .................... | F16J 15/062 |

(Continued)

OTHER PUBLICATIONS

International Search Report, Aug. 28, 2015.

*Primary Examiner* — Jack Berman
(74) *Attorney, Agent, or Firm* — Tristan A. Fuierer; Moore & Van Allen, PLLC

(57) ABSTRACT

A flow directing gasket for improving the flow of a gas or liquid across electron beam transparent membranes in environmental cells within a sample holder of an electron microscope, and uses of the sample holders comprising said flow directing gaskets.

19 Claims, 20 Drawing Sheets

(56) References Cited

U.S. PATENT DOCUMENTS

| | | |
|---|---|---|
| 2009/0045349 A1 | 2/2009 | Sprinzak et al. |
| 2010/0068585 A1 | 3/2010 | Hoppes et al. |
| 2012/0017415 A1 | 1/2012 | Marsh et al. |
| 2012/0103807 A1 | 5/2012 | Dattelbaum et al. |
| 2012/0305769 A1 | 12/2012 | Yaguchi et al. |
| 2014/0138558 A1 | 5/2014 | Damiano, Jr. et al. |
| 2014/0268321 A1 | 9/2014 | Damiano, Jr. et al. |
| 2014/0361194 A1 | 12/2014 | Damiano et al. |

* cited by examiner

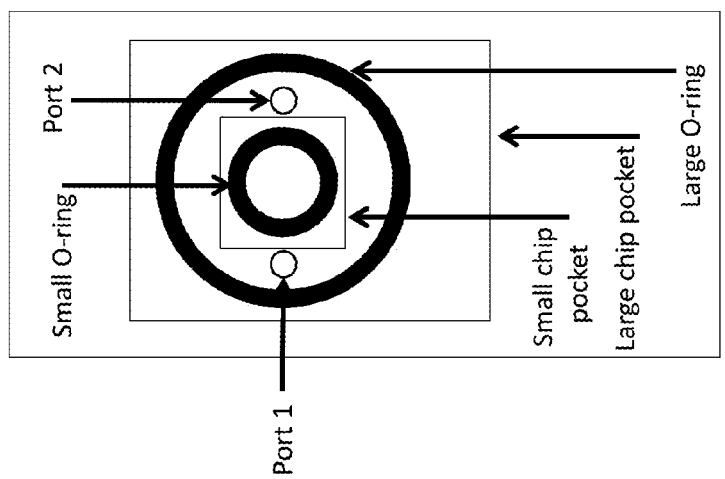
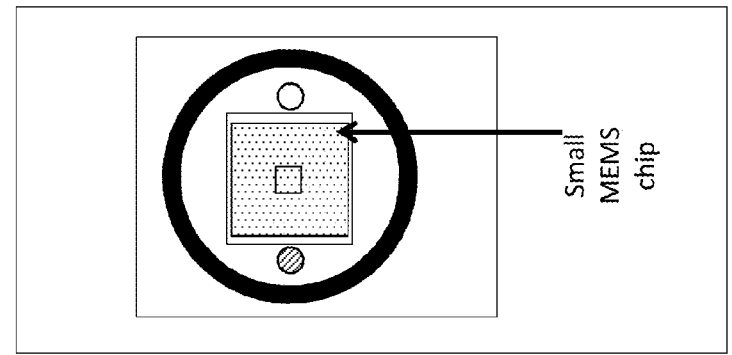
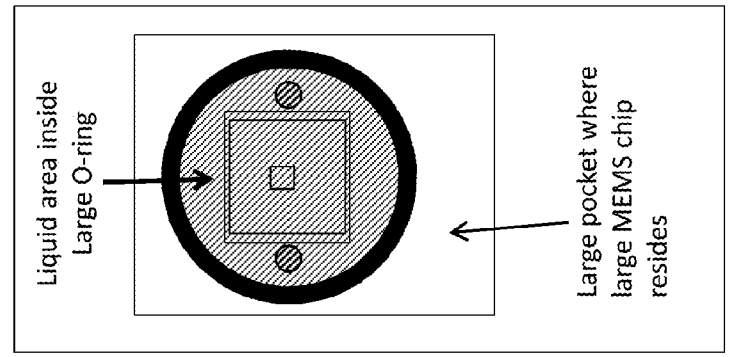
FIGURE 4
Prior Art

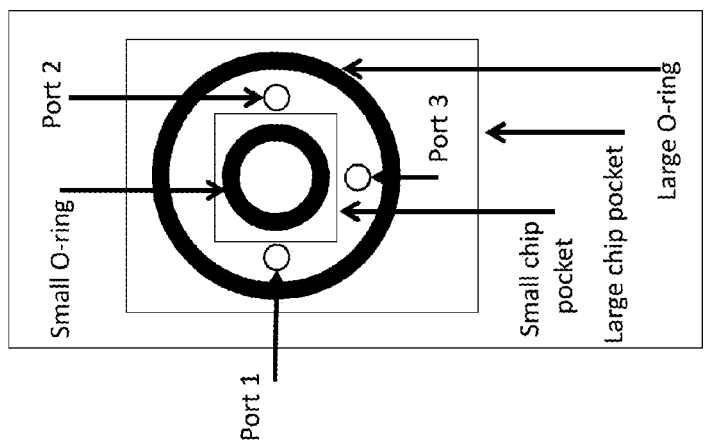
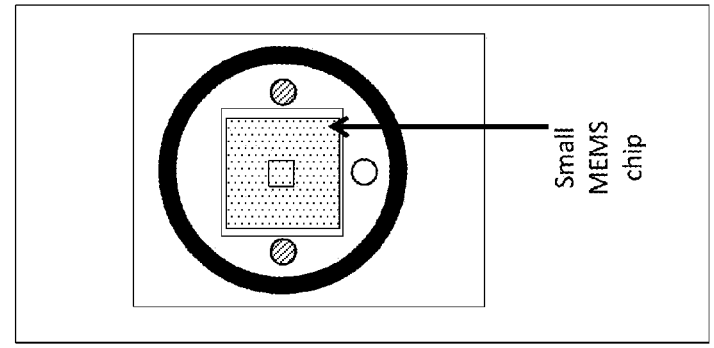
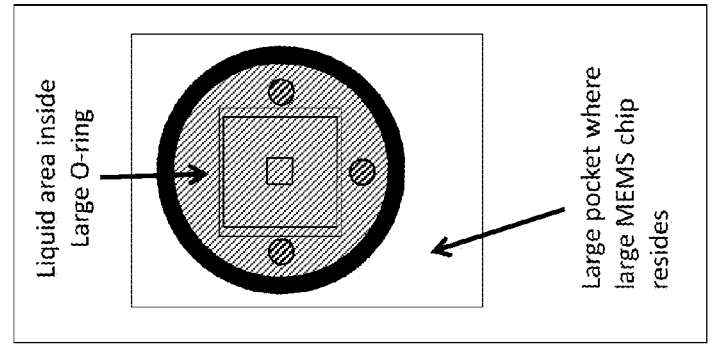
FIGURE 5
Prior Art

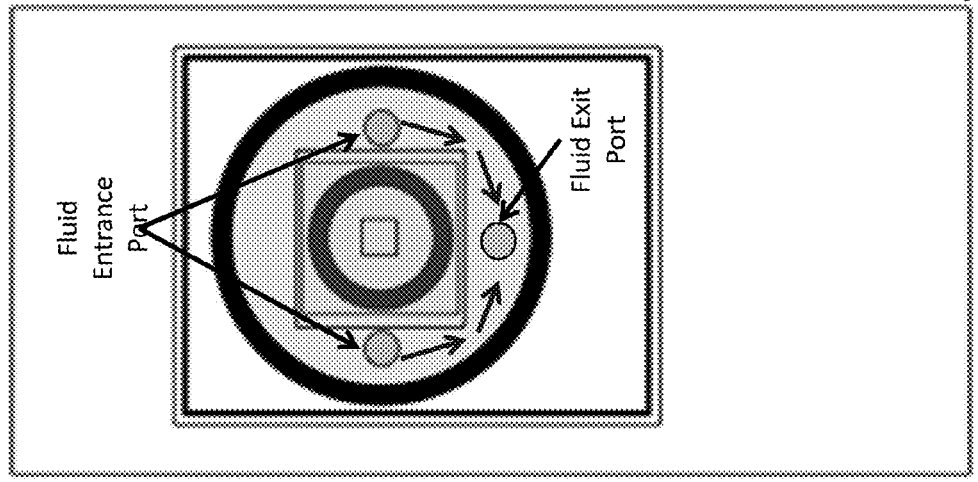
Fig. 6b
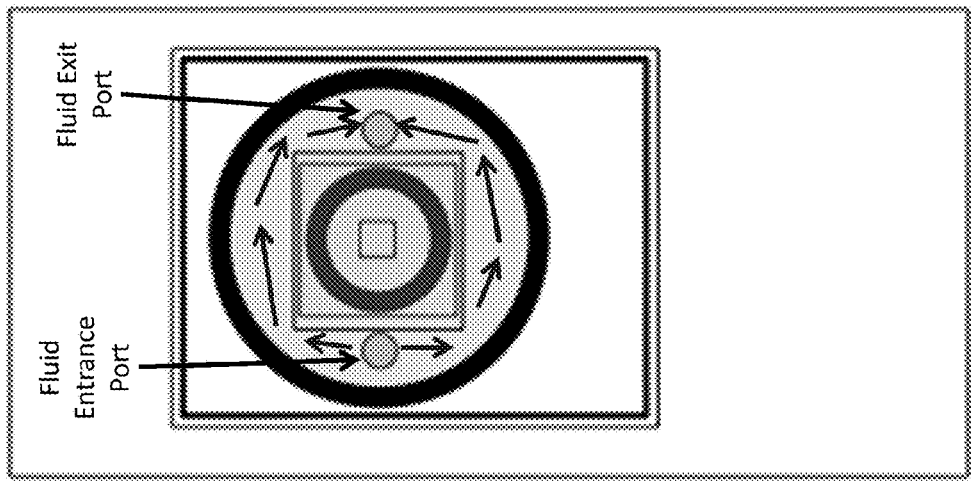
Fig. 6a
FIGURE 6
Prior Art

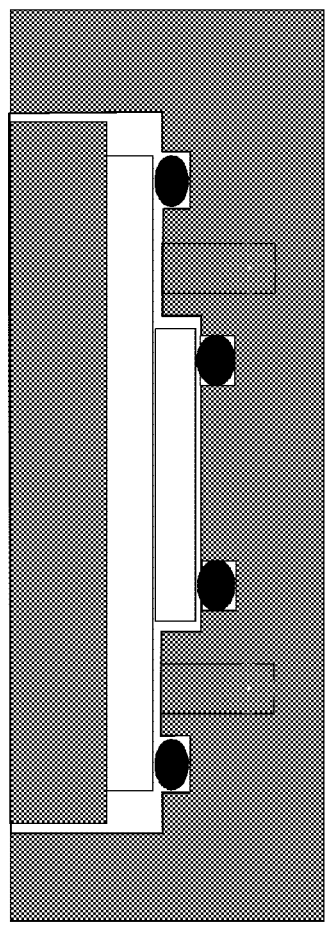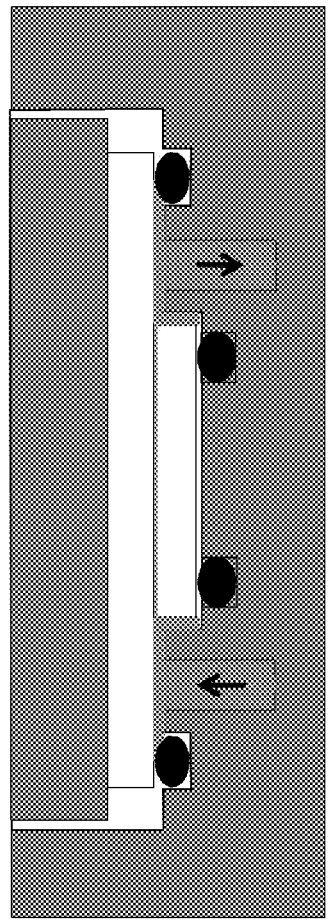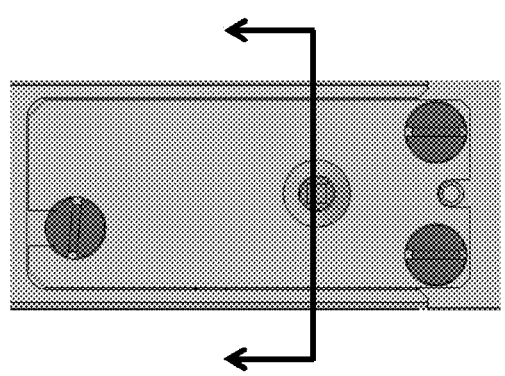
FIGURE 7
Prior Art

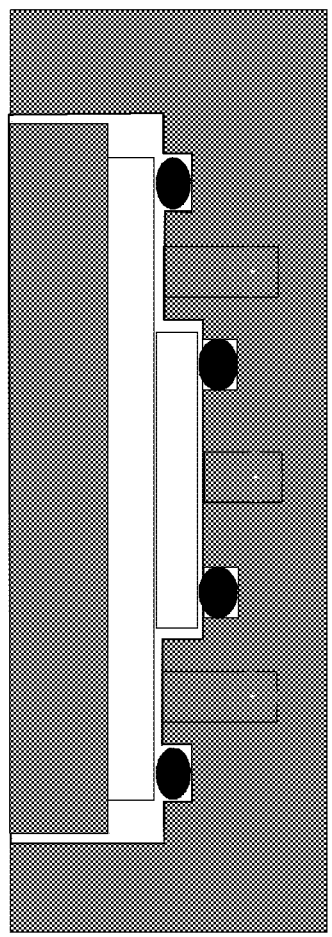
Fig. 8b
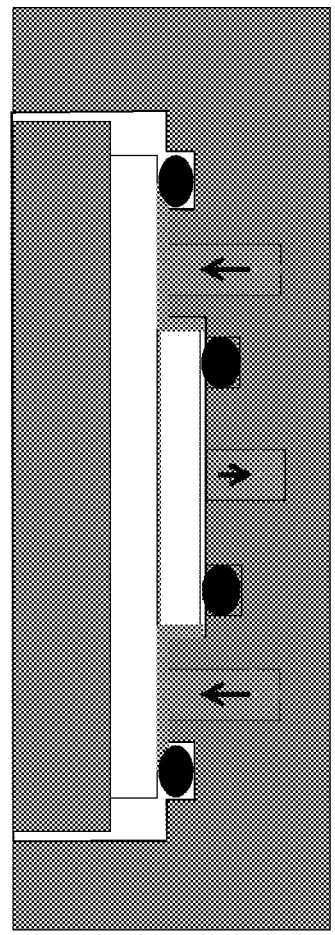
Fig. 8c
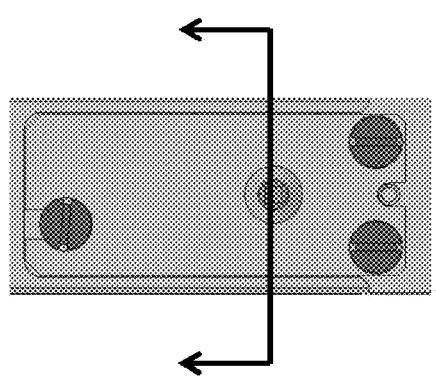
Fig. 8a
FIGURE 8
Prior Art

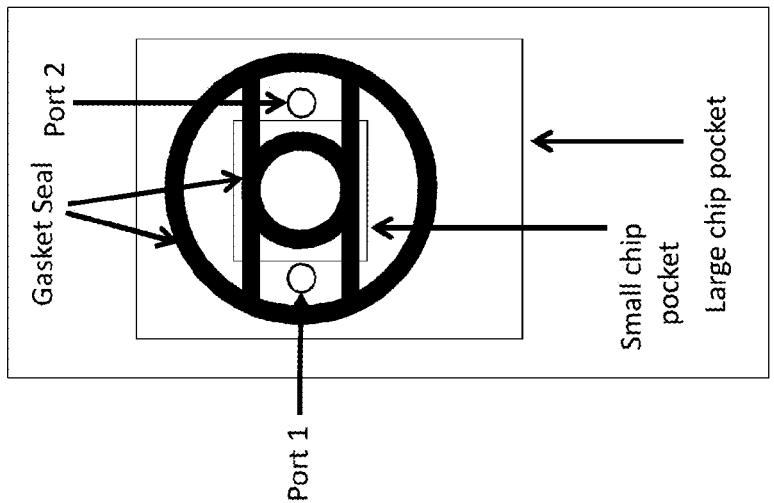
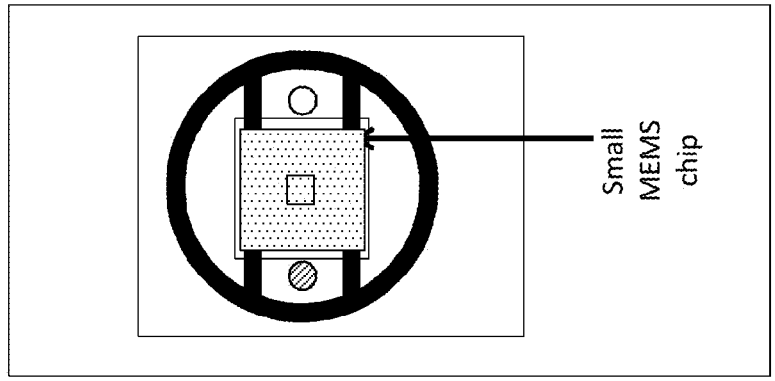
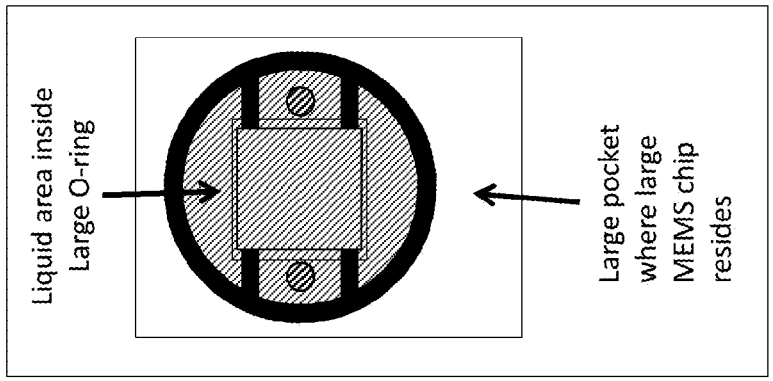

TEM environmental cell showing a fluid filled cavity. Fluid flowing into cell at Port 1 and Port 2 and exiting cell on Port 3. Gasket ensures all flow is between the two MEMs chips.

TEM environmental cell w/ small MEMS chip. Fluid begins flowing into cell at Port 1 and Port 2.

TEM environmental cell – shown without MEMS chips. Shown with gasket seal feature. No fluid flow.

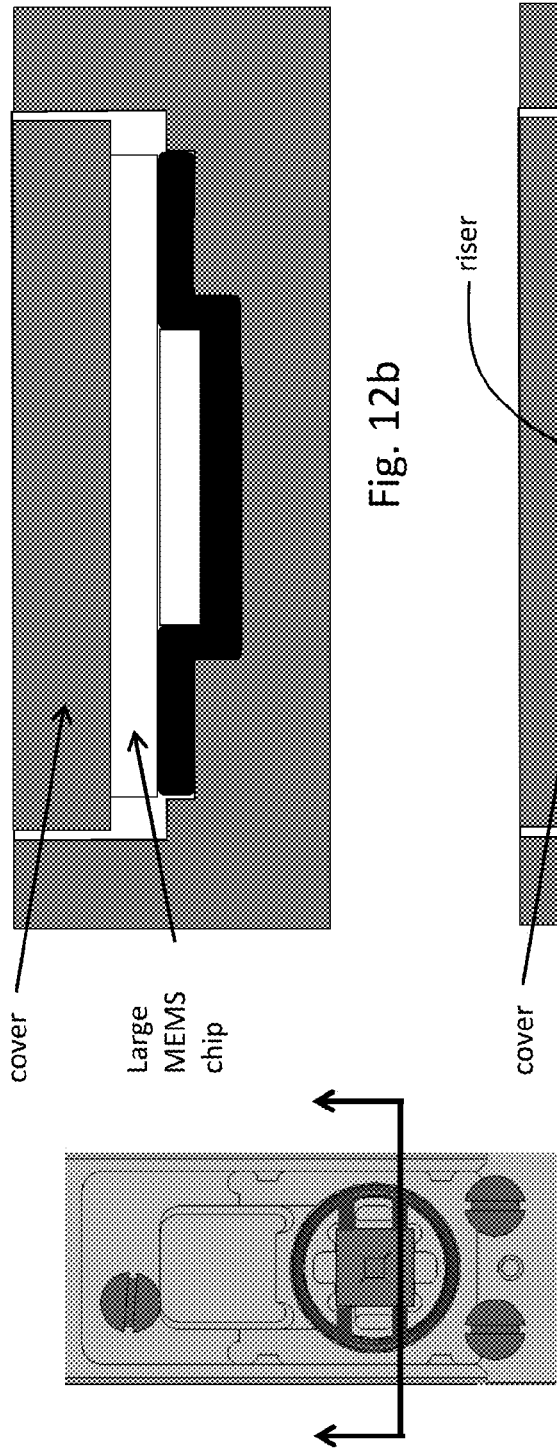

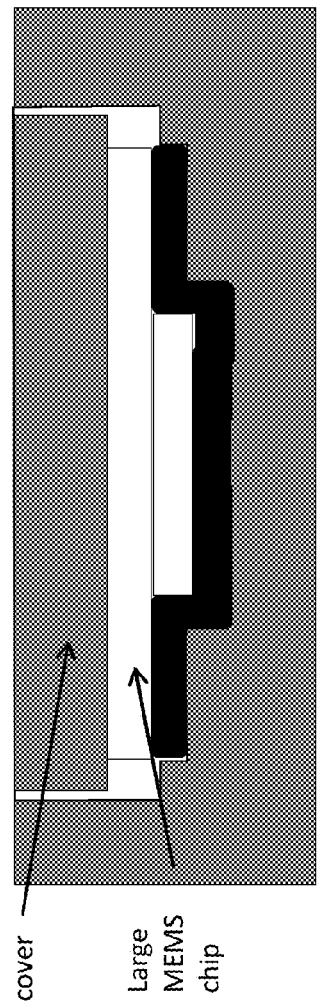
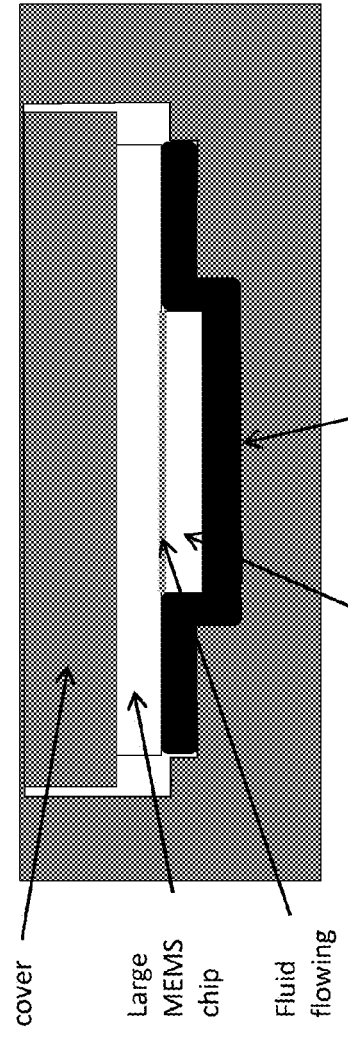
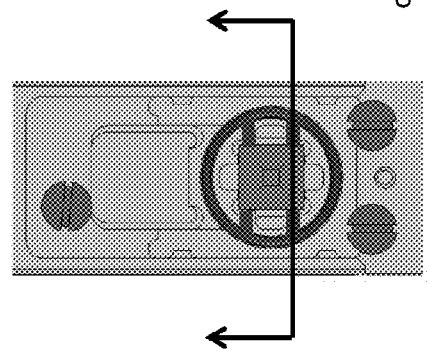
Fig. 13b
Fig. 13c
Fig. 13a
gasket
Small MEMS chip
cover
Large MEMS chip
cover
Large MEMS chip
Fluid flowing Alternative gasket shape.

Port 3
Port 1
Port 2

Port 3
Port 1
Port 2

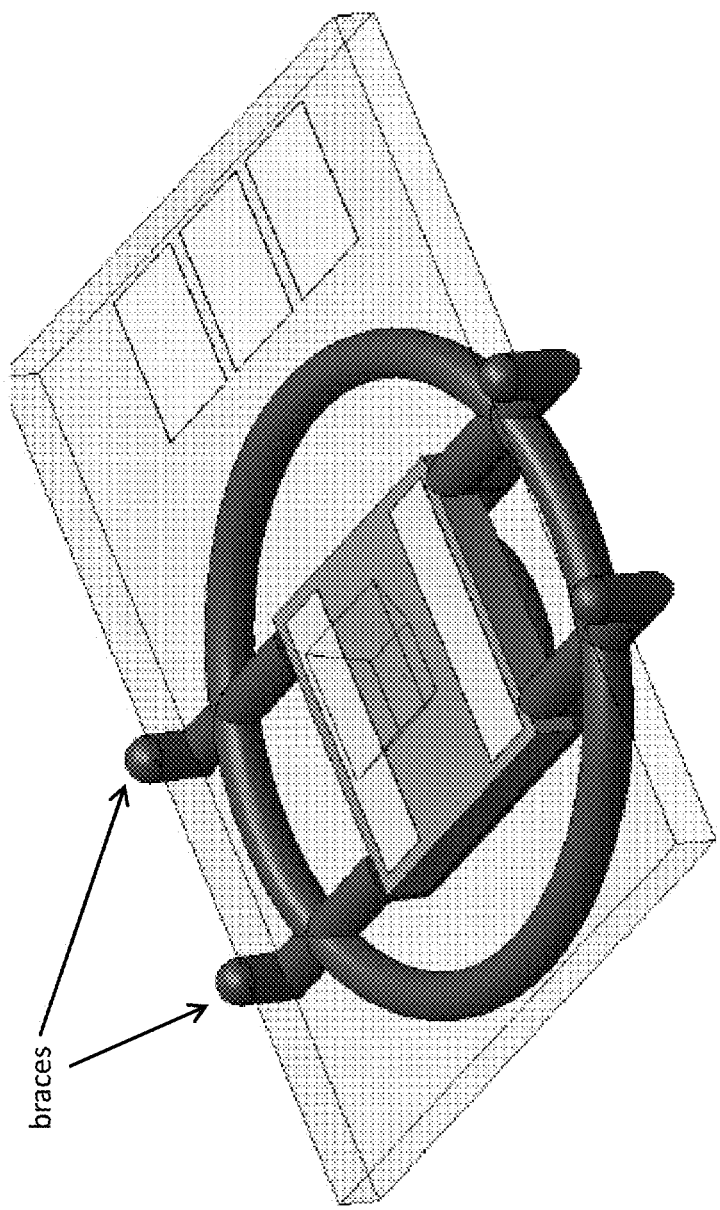

METHOD FOR OPTIMIZING FLUID FLOW ACROSS A SAMPLE WITHIN AN ELECTRON MICROSCOPE SAMPLE HOLDER

CROSS REFERENCE TO RELATED APPLICATIONS

This application is filed under the provisions of 35 U.S.C. §111(a) and claims priority to U.S. Provisional Patent Application No. 62/007,162 filed on Jun. 3, 2014 in the name of Daniel Stephen Gardiner and entitled "Method for Optimizing Fluid Flow Across a Sample Within an Electron Microscope Sample Holder," which is hereby incorporated by reference herein in its entirety.

FIELD

The invention relates generally to a method for improving the flow of a gas or liquid across the electron beam transparent membranes within a sample holder for an electron microscope, e.g., a transmission electron microscope (TEM), a scanning transmission electron microscopy (STEM) and variations of the scanning electron microscopes (SEM) that use traditional TEM-type holders and stages, for imaging and analysis.

BACKGROUND

The sample holder is a component of an electron microscope providing the physical support for samples under observation. To use the sample holder, one or more samples are first placed on a sample support device. The sample support device is then mechanically fixed in place at the specimen tip, and the sample holder is inserted into the electron microscope through a load-lock. During insertion, the sample holder is pushed into the electron microscope until it stops, which results in the specimen tip of the sample holder being located in the column of the microscope. To maintain an ultra-high vacuum environment inside the electron microscope, flexible o-rings are typically found along the barrel of the sample holder, and these o-rings seal against the microscope when the sample holder is inserted.

Certain sample holders can be used to provide a means for gas or liquid to flow into and out of a cavity at the tip of the holder (see, for example FIGS. 1 and 2). These sample holders include devices, e.g., semiconductor devices, which are designed with relatively thin electron beam transparent membranes, positioned in the cavity at the tip of the holder. To establish temporary or continuous flow of liquid or gas, a pump located external to the sample holder can be used to force liquids into the cavity at the tip of the holder, including between two MEMS devices which define an environmental cell. Since the pumping equipment is outside of the holder, various connectors are used to bring the liquid to the sample holder, down the length of the holder, to the cavity at the tip of the holder, and back out of the sample holder. Use of a pump to flow the liquid is typical, but any method of creating a pressure differential could be used to establish flow. For example, a pressurized reservoir on the entry port or a depressurized reservoir on the exit port(s) would also establish flow.

One type of sample support device is an environmental cell which comprises two semiconductor devices, i.e., MEMS devices, comprising thin membrane windows and samples positioned between the semiconductor devices, wherein the sample's environment, including an electrical field and a gas or liquid flow, can be precisely controlled. The present inventors previously described novel apparatuses and methods to contact and align devices used to form liquid or gas cells in International Patent Application No. PCT/US2011/46282 filed on Aug. 2, 2011 entitled "ELECTRON MICROSCOPE SAMPLE HOLDER FOR FORMING A GAS OR LIQUID CELL WITH TWO SEMICONDUCTOR DEVICES," which is hereby incorporated herein in its entirety.

There are many reasons why environmental cell users desire liquid to flow either intermittently or continuously: flow provides a means to keep the sample hydrated; flow allows the user to create a reaction that can be viewed in the microscope real time; and a system that includes at least three ports allows users to combine two or more fluids within the cavity at the tip of the holder.

The environmental cells are typically designed such that the two semiconductor devices are substantially parallel to one another and positioned about 50 nm to about 5 µm relative to one another. This ensures small liquid layers therebetween, which maximizes the microscope resolution of the sample, which becomes less resolute as the electron beam of the microscope travels through greater thicknesses of liquid. That said, the typical design of the environmental cells allow much greater volumes of fluid to flow around the semiconductor devices than across them. For example, in the case of a 150 nm environmental cell thickness on a Protochips Poseidon 200 holder, there is approximately 500 times more cross sectional area around the E-chip than across the membrane. This creates difficulties for the users of environmental flow cells:

1.) The electron beam can create heat that can evaporate the liquid in the cell. In many cases, greater flow across the semiconductor devices is needed to replace the volume of gas created by electron beam heating. Increasing the flow rate into the tip of the cell can help, but it brings higher risk of over pressurizing the cavity, potentially causing damage;

2.) Sometimes it is difficult to prepare and/or maintain the desired surface energy of the semiconductor devices. For example, if a surface is hydrophobic, it can be difficult to establish the fluid environment desired for a given experiment.

3.) Flow rates are typically adjusted by the user with an external pump system to attain the desired flow rate for sample imaging. If the majority of liquid flows around the sample area than across it, the flow rates may need to be as high as 150 microliters per hour or even higher. With a design where there is less fluid bypassing the membranes, the flow rate can be decreased. This reduction in flow rate improves safety of the microscope, e.g., in the event of a membrane break, less fluid will be able to escape into the column of the microscope.

4.) Users that want to combine known quantities of two liquids between the semiconductor devices are not able to quantify the ratio of the two fluids at the viewing area, i.e., the membranes of the semiconductor devices. This is because it is not possible to know how much liquid of one fluid bypasses the semiconductor devices as compared to the second fluid. This is due to asymmetry in the tip of the sample holder during assembly;

5.) In some cases, the research benefits from knowing the actual rate of fluid flow. This is especially important for those studying reactions; and 6.) Electrochemistry reactions can require rapid replenishment of the electrolyte liquid to prevent the membrane area from becoming dry.

Accordingly, a fluidic cell that can overcome evaporation effects and provide a known flow volume at of fluid at safe pressures across the sample is needed. Towards that end, an invention is disclosed herein to deliver quantifiable amounts of liquid to the membrane of an environmental holder.

SUMMARY

The present invention generally relates to sample holders comprising flow directing gaskets so that fluid can be directed between MEMS chips in environment cells, and uses of the sample holders comprising said flow directing gaskets.

In one aspect, a flow directing gasket is described, said flow directing gasket comprising:

a first gasket having a first enclosed area, wherein the first gasket forms a seal on a first substantially planar surface;

a second gasket having a second enclosed area, wherein the second gasket forms a seal on a second substantially planar surface;

wherein the second enclosed area is smaller than the first enclosed area; and at least one arm member that is attached to both the first and second gaskets, wherein the second gasket is on a plane that is different from that of the first gasket.

In another aspect, a sample holder for an electron microscope is described, said sample holder comprising a sample holder body, a sample holder cover, and a flow directing gasket, wherein said flow directing gasket comprises:

a first gasket having a first enclosed area, wherein the first gasket forms a seal on a first substantially planar surface;

a second gasket having a second enclosed area, wherein the second gasket forms a seal on a second substantially planar surface;

wherein the second enclosed area is smaller than the first enclosed area; and at least one arm member that is attached to both the first and second gaskets, wherein the second gasket is on a plane that is different from that of the first gasket.

In still another aspect, a method of imaging a sample in a liquid and/or gaseous environment in an electron microscope is described, said method comprising inserting a sample in a sample holder, inserting the sample holder comprising the sample in an electron microscope, introducing a liquid and/or gas to the sample in the sample holder, and imaging the sample in the electron microscope, wherein the sample holder comprises a sample holder body, a sample holder cover, and a flow directing gasket, wherein said flow directing gasket comprises:

a first gasket having a first enclosed area, wherein the first gasket forms a seal on a first substantially planar surface;

a second gasket having a second enclosed area, wherein the second gasket forms a seal on a second substantially planar surface;

wherein the second enclosed area is smaller than the first enclosed area; and at least one arm member that is attached to both the first and second gaskets, wherein the second gasket is on a plane that is different from that of the first gasket.

Other aspects, features and embodiments of the invention will be more fully apparent from the ensuing disclosure and appended claims.

BRIEF DESCRIPTION OF THE FIGURES

FIG. 3a is a plan view of an embodiment of the closed sample holder cell with the sample holder cover on.

FIG. 3b is a plan view of the sample holder cell of FIG. 3a with the sample holder cover off FIG. 3c is a plan view of the sample holder cell of FIG. 3b with the large MEMS chip removed.

FIG. 3d is a plan view of the sample holder cell of FIG. 3c with the small MEMS chip removed.

FIG. 4a is a plan view of the fluidic cavity within the two-port closed cell showing the large and small O-rings, the two ports, and the large and small MEMS chip pockets.

FIG. 4b is a plan view of the closed cell with small MEMS chip (dotted) positioned in the cell over the small O-ring with the fluid, e.g., liquid or gas, beginning to flow into the cell from port 1.

FIG. 4c is a plan view of the closed cell where the fluid has filled the cavity and exits the cavity via port 2.

FIG. 5a is a plan view of the fluidic cavity within the three-port closed cell showing the large and small O-rings, the three ports, and the large and small MEMS chip pockets.

FIG. 5b is a plan view of the closed cell with small MEMS chip (dotted) positioned in the cell over the small O-ring with the fluid, e.g., liquid or gas, beginning to flow into the cell from ports 1 and 2.

FIG. 5c is a plan view of the closed cell where the fluid has filled the cavity and exits the cavity via port 3.

FIG. 6a illustrates the fluid flow path within a two port cell.

FIG. 6b illustrates the fluid flow path within a three port cell.

FIG. 7a is a plan view of a two port cell.

FIG. 7b illustrates the cross-section of the cell of FIG. 7a, where FIG. 7b corresponds to the cell without fluid.

FIG. 7c illustrates the cross-section of the cell of FIG. 7a, where FIG. 7c is the cell with fluid flowing through it.

FIG. 8a is a plan view of a three port cell.

FIG. 8b illustrates the cross-section of the cell of FIG. 8a, where FIG. 8b corresponds to the cell without fluid.

FIG. 8c illustrates the cross-section of the cell of FIG. 8a, where FIG. 8c is the cell with fluid flowing through it.

FIG. 9a is a plan view of the fluidic cavity within the two-port closed cell showing a flow-directing gasket, the two ports, and the large and small MEMS chip pockets.

FIG. 9b is a plan view of the closed cell with small MEMS chip (dotted) positioned in the cell over the small gasket of the flow-directing gasket with the fluid, e.g., liquid or gas, beginning to flow into the cell from port 1.

FIG. 9c is a plan view of the closed cell where the fluid has filled the cavity and exits the cavity via port 2.

FIG. 12a is a plan view of a two port cell without the cover on or the large MEMS chip.

FIG. 12b illustrates the cross-section of the cell of FIG. 12a, where FIG. 12b corresponds to the cell without fluid.

FIG. 12c illustrates the cross-section of the cell of FIG. 12a, where FIG. 12c is the cell with fluid flowing through it.

FIG. 13a is a plan view of a three port cell without the cover on or the large MEMS chip.

FIG. 13b illustrates the cross-section of the cell of FIG. 13a, where FIG. 13b corresponds to the cell without fluid.

FIG. 13c illustrates the cross-section of the cell of FIG. 13a, where FIG. 13c is the cell with fluid flowing through it.

FIG. 16c illustrates the positioning of the gasket in the sample holder of FIG. 16a.

FIG. 19 illustrates another embodiment of the flow directing gasket having braces for securing the large MEMS device.

DETAILED DESCRIPTION

Figure 1:
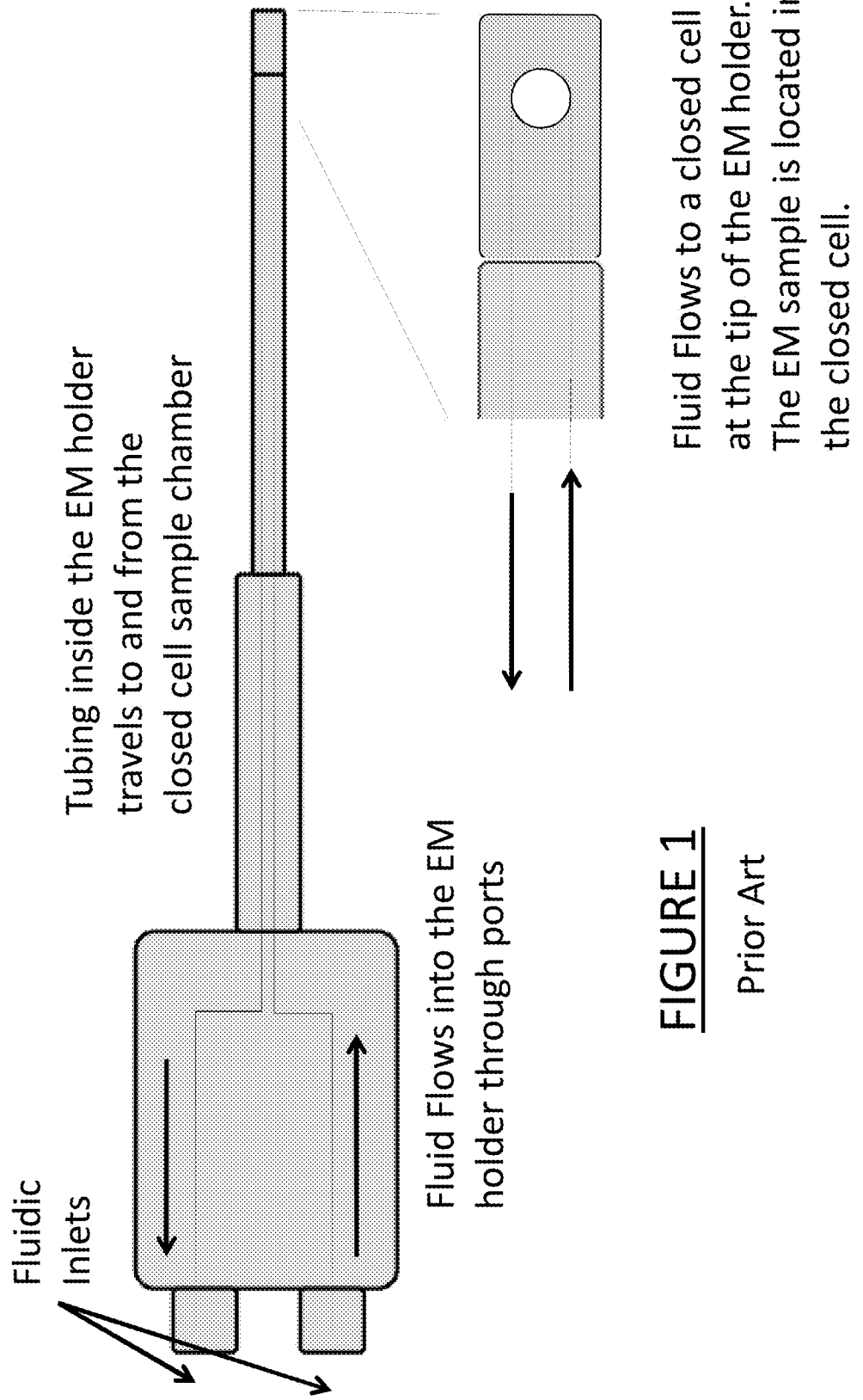
FIG. 1 illustrates a typical electron microscope sample holder having two ports for gas or liquid to flow into and out of a cavity at the tip of the holder.

The present invention generally relates to sample holders comprising flow directing gaskets so that fluid can be directed between MEMS chips in environment cells, and uses of the sample holders comprising said flow directing gaskets. It is to be understood that the sample holder and sample holder interface described herein are compatible with and may be interfaced with the sample support devices, e.g., semiconductor sample support devices, disclosed in International Patent Application Nos. PCT/US08/63200 filed on May 9, 2008, PCT/US11/46282 filed on Aug. 2, 2011, and PCT/US08/88052 filed on Dec. 22, 2008, which are all incorporated herein by reference in their entireties. It should also be appreciated by one skilled in the art that alternative sample support devices may be interfaced with the sample holder described herein. The sample holder provides mechanical support for one or more samples or sample support devices and also provides other stimuli (e.g., temperature, electricity, mechanical, chemical, gas or liquid, or any combination thereof) to the samples or sample support devices. The sample holder can be manufactured with tips, barrels and ends of various shapes and sizes such that the sample holder fits any manufacturer's electron microscope.

As used herein, a "sample support device" corresponds to a structure that holds a sample for microscopic imaging. A sample support device can provide an experimental region. Devices may include one, more than one or even an array of experimental regions and may include integrated features such as electrodes, thermocouples, and/or calibration sites, as readily determined by one skilled in the art. One preferred embodiment includes sample support devices made with MEMS technology and with thin membranes (continuous or perforated) for supporting a sample in the experimental region. Sample support devices include, but are not limited to, a window device, an electrical device and a heating device.

As defined herein, a "membrane region" on the sample support device corresponds to unsupported material comprising, consisting of, or consisting essentially of carbon, silicon nitride, SiC or other thin films generally 1 micron or less having a low tensile stress (<500 MPa), and providing a region at least partially electron transparent region for supporting the at least one sample. The membrane region may include holes or be hole-free. The membrane region may be comprised of a single material or a layer of more than one material and may be either uniformly flat or contain regions with varying thicknesses.

The general area of "in situ" electron microscopy involves applying stimulus to a sample during imaging. The stimulus could be thermal (heating or cooling), electrical (applying a voltage or current), mechanical (applying stress or strain), chemical (containing a sample in a specific chemical environment), or several of these at once.

As defined herein, a "cell" corresponds to a region defined by two substantially parallel positioned devices, wherein at least one liquid and/or gas can be flowed therethrough. A sample can be positioned within the cell for imaging purposes.

As defined herein, "sample" means the object being studied in the electron microscope, typically placed within or on the device in the region of liquid or gas control which is at least partially electron transparent (e.g., nanoparticle, catalyst, thin section, etc.).

As defined herein, a "pocket" corresponds to a space in the sample holder that defines the vertical walls of the cell, into which the two substantially parallel devices are positioned to form the cell.

As defined herein, "window device" means a device used to create a physical, electron transparent barrier on one boundary and the vacuum environment of the electron microscope on the other and is generally a silicon nitride-based semiconductor micro-machined part, although other semiconductor materials are contemplated.

As defined herein, an "arm member" corresponds to a portion of the gasket that connects the outer gasket (i.e., the first gasket) to the inner gasket (i.e., the second gasket) and ensures that the fluids flow between two MEMS chips and to provide a known flow volume at of fluid at safe pressures across the sample. Further, the arm member can provide a holding force to the MEMS device.

Figure 2:
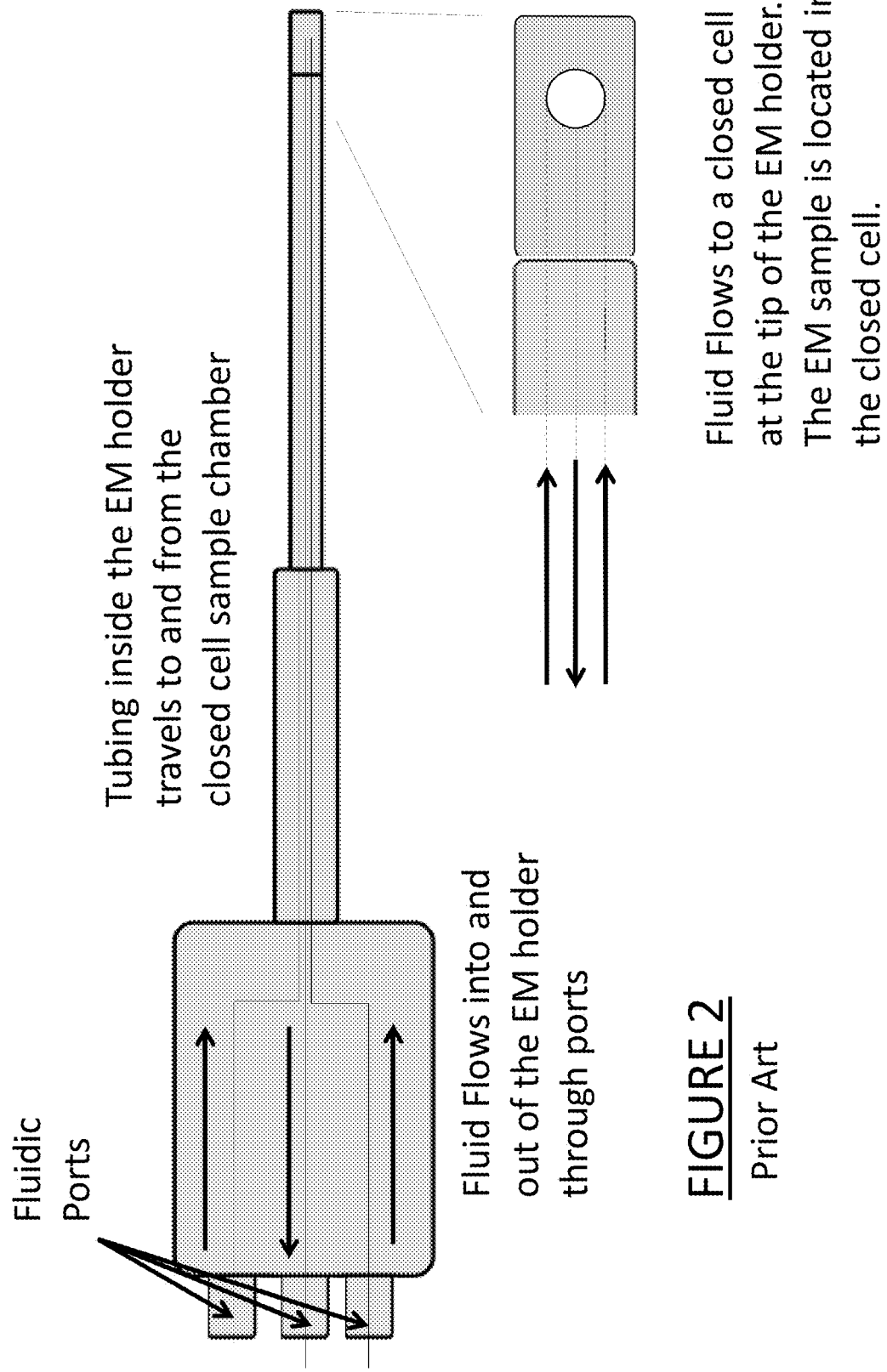
FIG. 2 illustrates another embodiment of a typical electron microscope sample holder having three ports for gas or liquid to flow into and out of a cavity at the tip of the holder.

FIGS. 1 and 2 show a general depiction of a two port closed cell holder and a three port closed cell holder, respectively, wherein the sample holder includes tubing inside the electron microscope (EM) holder that travels to and from the closed cell at the specimen tip. The placement of the tubing is just for general illustration and is not intended to limit the holder in any way. The tubing permits fluids, e.g., gases or liquids, to travel to the closed cell, for in situ analysis of the sample positioned in the closed cell.

Figure 3:
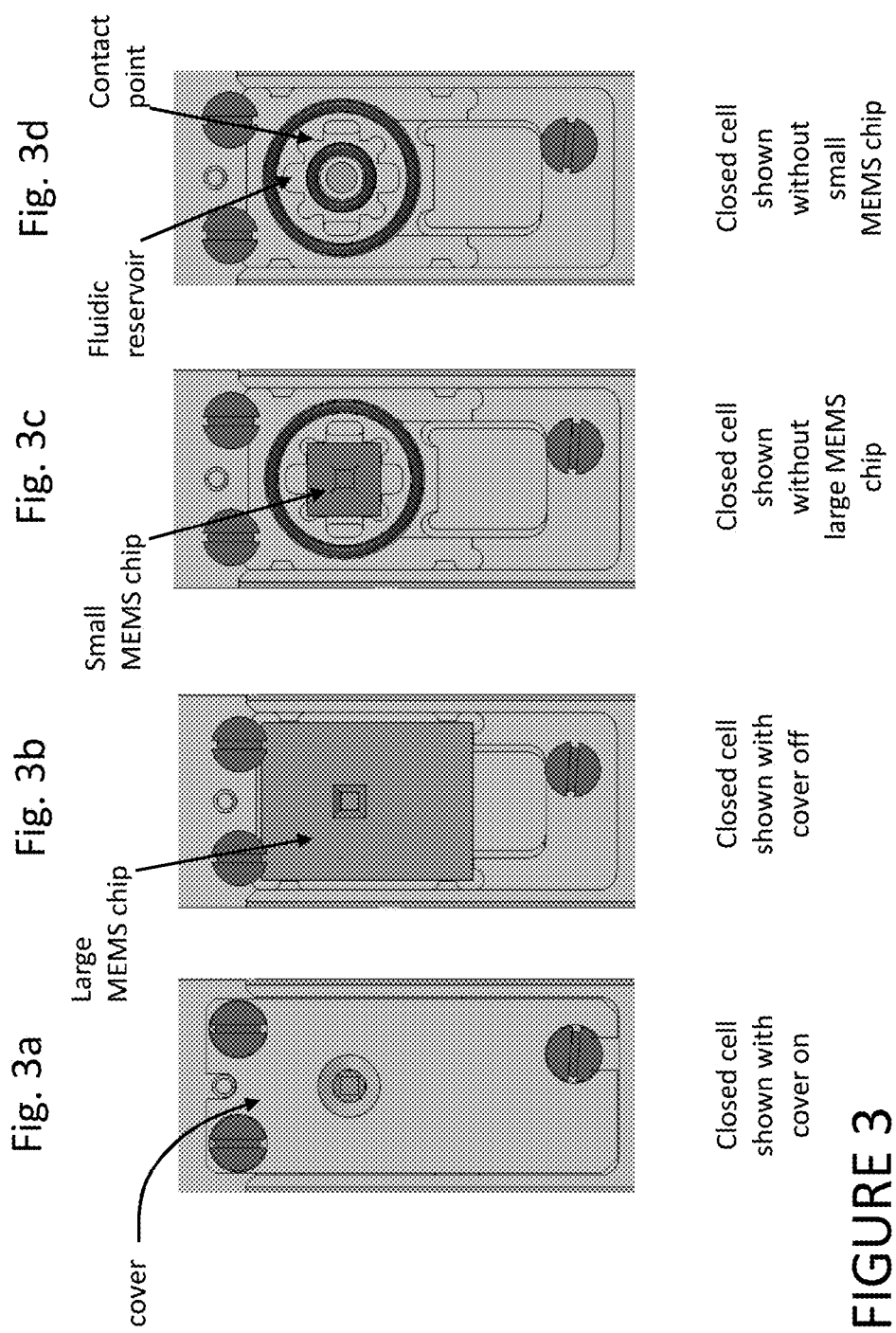

FIGS. 3a-3d illustrate an example of the closed cell that is positioned at the specimen tip. The closed cell in FIGS. 3a-3d is just for general illustration and is not intended to limit the closed cell in any way. FIG. 3a is a plan view of the closed cell, wherein a cover of the closed cell is shown positioned and affixed, e.g., with screws, to the cell. FIG. 3b is a plan view of the closed cell with the cover off, revealing the first of two MEMS chips (i.e., a sample support device) positioned in the cell. FIG. 3c is a plan view of the closed cell showing the second of two MEMS chips after the first MEMS chip is removed. The large and small MEMS chips are stacked on top of one another and the sample "sandwiched" between the two chips. FIG. 3c also reveals the first of two O-rings, which is positioned below the large MEMS chip (e.g., a thermal or electrical device) to seal the cell so liquid or gas can be introduced into the cell. FIG. 3d is a plan view of the closed cell showing the bottom of the cell after the second MEMS chip (e.g., a window device) is removed. FIG. 3d also reveals the second of two O-rings, which is positioned below the small MEMS chip to form the second seal so liquid or gas can be introduced into the cell. The fluidic reservoir in FIG. 3d corresponds to the area between the two O-rings when the MEMS chips are in place. Although not illustrated in FIGS. 3a-3d per se, the fluidic reservoir indicated in FIG. 3d has depth to accommodate the MEMS chips. It should be appreciated that the "closed cell" remains in fluid communication with fluidic inlets and hence the closed cell receives fluids from an external source and fluids are returned from the closed cell to an external source. Further, the closed cell has a pocket(s) that can include contact points, or protrusions, rather than straight edge walls so as to improve alignment of the devices in the cell holders. Further, in FIGS. 3a-3d, as well as every other sample holder described herein, the holder can have grooves that accept the gasket to fix the gasket position in the sample holder.

FIGS. 4a-4c illustrates the fluidic cavity within a two port closed cell that is positioned at the specimen tip. The closed cell in FIGS. 4a-4c, which does not illustrate the cover nor the large MEMS chip, is just for general illustration and is not intended to limit the closed cell in any way. FIG. 4a is a plan view of the fluidic cavity within the two-port closed cell showing the large and small O-rings, the two ports, and the large and small MEMS chip pockets. It should be appreciated that the chip pockets can include the aforementioned protrusions, which are not shown in FIGS. 4a-4c. FIG. 4b is a plan view of the closed cell with small MEMS chip (dotted) positioned in the cell over the small O-ring with the fluid, e.g., liquid or gas, beginning to flow into the cell from port 1. FIG. 4c is a plan view of the closed cell where the fluid has filled the cavity and exits the cavity via port 2. Although not shown, in order to fill the cavity as depicted in FIG. 4c, the large MEMS chip has to be in place in the larger pocket covering the large O-ring. The large MEMS chip is not shown so that the filled cavity can be envisioned.

FIGS. 5a-5c illustrates the fluidic cavity within a three port closed cell that is positioned at the specimen tip. The closed cell in FIGS. 5a-5c, which does not illustrate the cover nor the large MEMS chip, is just for general illustration and is not intended to limit the closed cell in any way. FIG. 5a is a plan view of the fluidic cavity within the three-port closed cell showing the large and small O-rings, the three ports, and the large and small MEMS chip pockets. It should be appreciated that the chip pockets can include the aforementioned protrusions, which are not shown in FIGS. 5a-5c. FIG. 5b is a plan view of the closed cell with small MEMS chip (dotted) positioned in the cell over the small O-ring with the fluid, e.g., liquid or gas, beginning to flow into the cell from ports 1 and 2. FIG. 5c is a plan view of the closed cell where the fluid has filled the cavity and exits the cavity via port 3. Although not shown, in order to fill the cavity as depicted in FIG. 5c, the large MEMS chip has to be in place in the larger pocket covering the large O-ring. The large MEMS chip is not shown so that the filled cavity can be envisioned.

FIG. 6a illustrates the fluid flow path within a two port cell. Specifically, in a typical two port design, the fluid tends to flow around the small MEMS chip from port 1 to port 2. FIG. 6b illustrates the fluid flow path within a three port cell. Specifically, in a typical three port design, the fluid tends to flow around the small MEMS chip from ports 1 and 2 to port 3. Either way, the fluid will have higher flow rates where there is least resistance, which happens to be around the MEMS devices rather than across the membrane interface.

FIG. 7 illustrates the cross section of a two port cell. For example, FIGS. 7b and 7c illustrate the cross-section of the cell of FIG. 7a, where FIG. 7a is a plan view of a two port cell. FIG. 7b corresponds to the cell without fluid while FIG. 7c is the cell with fluid flowing through it. The purpose of FIG. 7 is to illustrate the gaps where there is less resistance to flow around the MEMS chips than the small gaps between the MEMS chips. The liquid flow will be higher in gaps of larger cross sectional area than those with small cross sectional area. Although not shown, the sample is positioned in the small gap between the MEMS chips.

FIG. 8 illustrates the cross section of a three port cell. For example, FIGS. 8b and 8c illustrate the cross-section of the cell of FIG. 8a, where FIG. 8a is a plan view of a three port cell. FIG. 8b corresponds to the cell without fluid while FIG. 8c is the cell with fluid flowing through it. The purpose of FIG. 8 is to illustrate the gaps where there is less resistance to flow around the MEMS chips than the small gaps between the MEMS chips. The liquid flow will be higher in gaps of larger cross sectional area than those with small cross sectional area. Although not shown, the sample is positioned in the small gap between the MEMS chips.

FIGS. 1 through 8 display a typical closed cell environmental cell holder of the prior art. Disadvantageously, due to the very small gaps between the membranes of the MEMS devices, fluid dynamics dictate an affinity for the majority of the fluid to bypass the membranes. In order to overcome this shortcoming, the option available to the user is increasing the flow rates through the cell, which will increase the pressure within the cell, creating a potential for leaks or other adverse affects.

FIGS. 9a-9c illustrates the fluidic cavity within a two port closed cell of the present invention. The closed cell in FIGS. 9a-9c, which does not illustrate the cover nor the large MEMS chip, is just for general illustration and is not intended to limit the closed cell in any way. FIG. 9a is a plan view of the fluidic cavity within the two-port closed cell showing a flow-directing gasket, the two ports, and the large and small MEMS chip pockets. The gasket can be made from typical elastomeric materials including, but not limited to, perfluoroelastomers, fluoroelastomers, and EPDM. Since the gasket is disposable, the user can simply select a material that is chemically compatible for their experiment. Although shown as one monolithic piece, it should be appreciated by the person skilled in the art that the gasket can comprise multiple pieces that can be put together to make the gasket. It should be appreciated that the chip pockets can include the aforementioned protrusions, which are not shown in FIGS. 9a-9c. FIG. 9b is a plan view of the closed cell with small MEMS chip (dotted) positioned in the cell over the small gasket of the flow-directing gasket with the fluid, e.g., liquid or gas, beginning to flow into the cell from port 1. FIG. 9c is a plan view of the closed cell where the fluid has filled the cavity and exits the cavity via port 2. Although not shown, in order to fill the cavity as depicted in FIG. 9c, the large MEMS chip has to be in place in the larger pocket covering the large gasket of the flow directing gasket. The large MEMS chip is not shown so that the filled cavity can be envisioned.

The flow directing gasket of FIGS. 9a-9c comprises generally a first gasket having a first two-dimensional shape having a first enclosed area; a second gasket having a second two-dimensional shape having a second enclosed area, wherein the second enclosed area is smaller than the first enclosed area; and at least one arm member that is attached to both the first and second gaskets, wherein the second gasket is on a plane that is different from that of the first gasket. Alternatively, the flow directing gasket of FIGS. 9a-9c comprises a first gasket having a first enclosed area, wherein the first gasket forms a seal on a first substantially planar surface; a second gasket having a second enclosed area, wherein the second gasket forms a seal on a second substantially planar surface; wherein the second enclosed area is smaller than the first enclosed area; and at least one arm member that is attached to both the first and second gaskets, wherein the second gasket is on a plane that is different from that of the first gasket. In either case, the first enclosed area can be circular or square or rectangular, and the second enclosed area can be circular or square or rectangular, wherein the shape of the first enclosed area and the second enclosed area can be the same as or different from one another, and wherein the second enclosed area is smaller than the first enclosed area. The first substantially planar surface corresponds to a surface of a larger MEMS device (see, for example, FIGS. 12b, 12c, 13b, and 13c) and the second substantially planar surface corresponds to a surface of the smaller MEMS device (see, for example, FIGS. 12b, 12c, 13b, and 13c). It should be appreciated that "substantially planar" is intended to capture surfaces (e.g., MEMS devices) that have irregularities on the surface but are ostensibly planar since the production of a perfectly planar surface is not always possible.

Figure 10C:
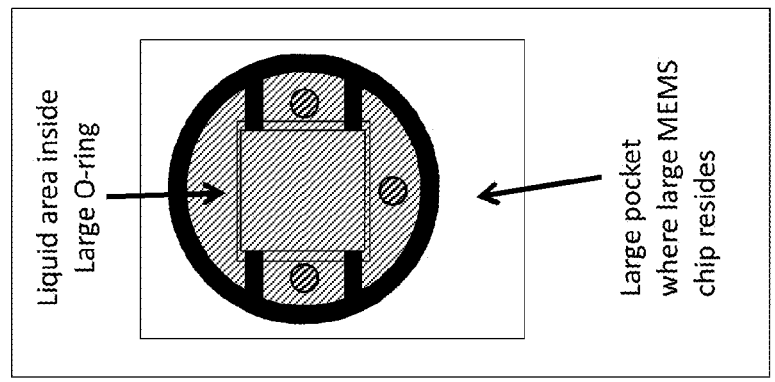
FIG. 10c is a plan view of the closed cell where the fluid has filled the cavity and exits the cavity via port 3.
Figure 10B:
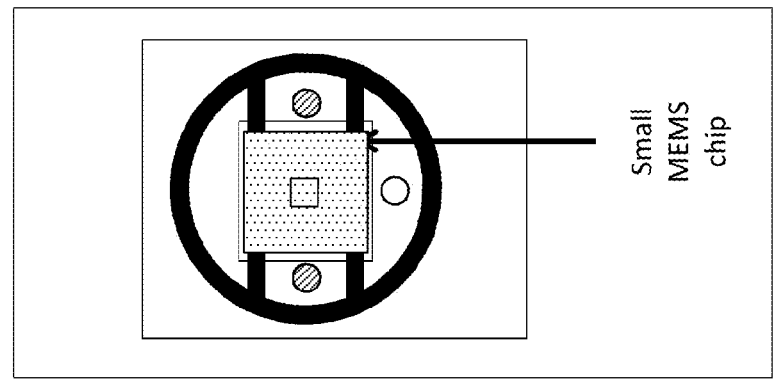
FIG. 10b is a plan view of the closed cell with small MEMS chip (dotted) positioned in the cell over the small gasket of the flow-directing gasket with the fluid, e.g., liquid or gas, beginning to flow into the cell from ports 1 and 2.
Figure 10A:
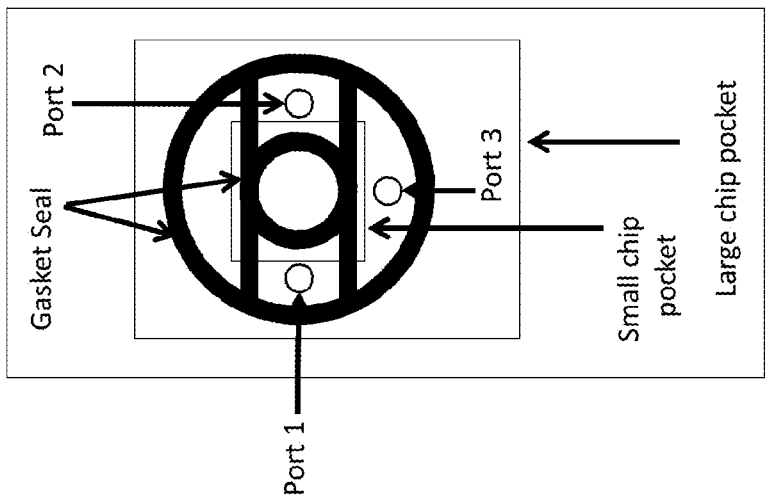
FIG. 10a is a plan view of the fluidic cavity within the three-port closed cell showing a flow-directing gasket, the three ports, and the large and small MEMS chip pockets.

FIGS. 10a-10c illustrates the fluidic cavity within a three port closed cell of the present invention. The closed cell in FIGS. 10a-10c, which does not illustrate the cover nor the large MEMS chip, is just for general illustration and is not intended to limit the closed cell in any way. FIG. 10a is a plan view of the fluidic cavity within the three-port closed cell showing a flow-directing gasket, the three ports, and the large and small MEMS chip pockets. It should be appreciated that the chip pockets can include the aforementioned protrusions, which are not shown in FIGS. 10a-10c. FIG. 10b is a plan view of the closed cell with small MEMS chip (dotted) positioned in the cell over the small gasket of the flow-directing gasket with the fluid, e.g., liquid or gas, beginning to flow into the cell from ports 1 and 2. FIG. 10c is a plan view of the closed cell where the fluid has filled the cavity and exits the cavity via port 3. Although not shown, in order to fill the cavity as depicted in FIG. 10c, the large MEMS chip has to be in place in the larger pocket covering the large gasket of the flow directing gasket. The large MEMS chip is not shown so that the filled cavity can be envisioned.

Figure 11B:
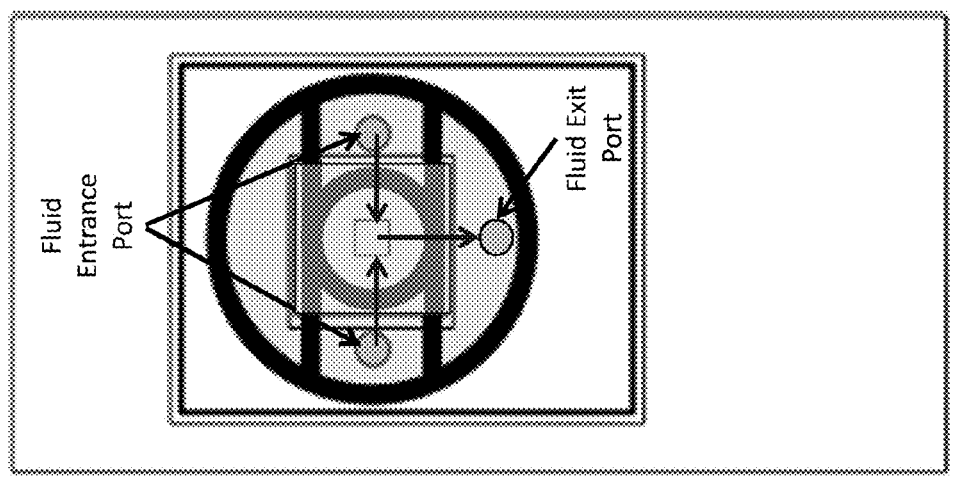
FIG. 11b illustrates the fluid flow path within a three port cell, wherein the two port cell includes the flow-directing gasket.
Figure 11A:
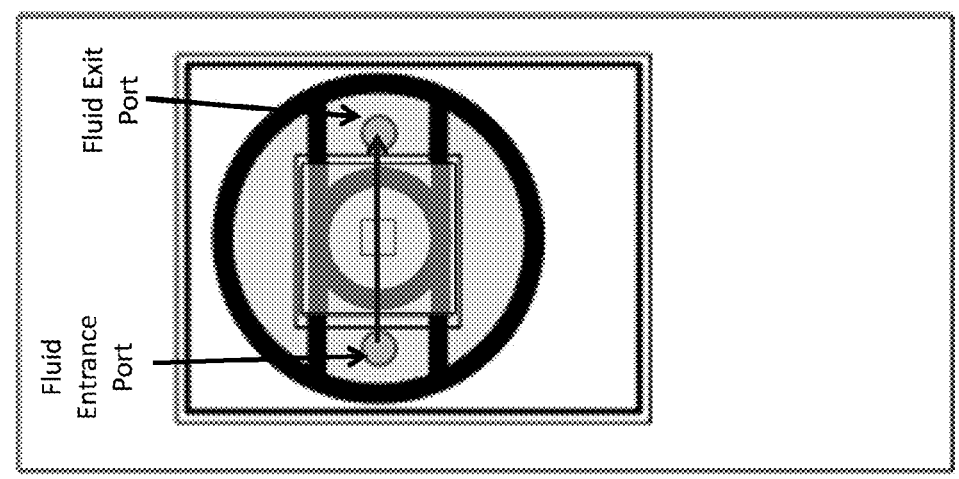
FIG. 11a illustrates the fluid flow path within a two port cell, wherein the two port cell includes the flow-directing gasket.

FIG. 11a illustrates the fluid flow path within a two port cell described herein, wherein the two port cell includes the flow-directing gasket. In the two port design, the fluid must flow across the interface of the MEMS chips from port 1 to port 2, as depicted by the arrow from port 1 to port 2. The elastomeric gaskets create a seal that would otherwise be a gap between the MEMS chips and the supporting structure. FIG. 11b illustrates the fluid flow path within a three port cell described herein, wherein the two port cell includes the flow-directing gasket. Similar to the two-port design, in the three port design, the fluid must flow across the interface of the MEMS chips from ports 1 and 2 to port 3, as depicted by the arrows in FIG. 11b.

FIG. 12 illustrates the cross section of a two port cell described herein. For example, FIGS. 12b and 12c illustrate the cross-section of the cell of FIG. 12a, where FIG. 12a is a plan view of a two port cell without the cover on or the large MEMS chip. FIG. 12b corresponds to the cell without fluid while FIG. 12c is the cell with fluid flowing through it. Of note, the cells in FIGS. 12b and 12c include the cover and the large MEMS chip, which were excluded from FIG. 12a for illustrative purposes only. The purpose of FIG. 12 is to illustrate the elimination of the gaps of FIG. 7 whereby the fluid flow is limited to the path between the MEMS chips. Although not shown, the sample is positioned in the small gap between the MEMS chips.

FIG. 13 illustrates the cross section of a three port cell described herein. For example, FIGS. 13b and 13c illustrate the cross-section of the cell of FIG. 13a, where FIG. 13a is a plan view of a three port cell without the cover on or the large MEMS chip. FIG. 13b corresponds to the cell without fluid while FIG. 13c is the cell with fluid flowing through it. Of note, the cells in FIGS. 13b and 13c include the cover and the large MEMS chip, which were excluded from FIG. 13a for illustrative purposes only. The purpose of FIG. 13 is to illustrate the elimination of the gaps of FIG. 8 whereby the fluid flow is limited to the path between the MEMS chips. Although not shown, the sample is positioned in the small gap between the MEMS chips.

Figure 14B:
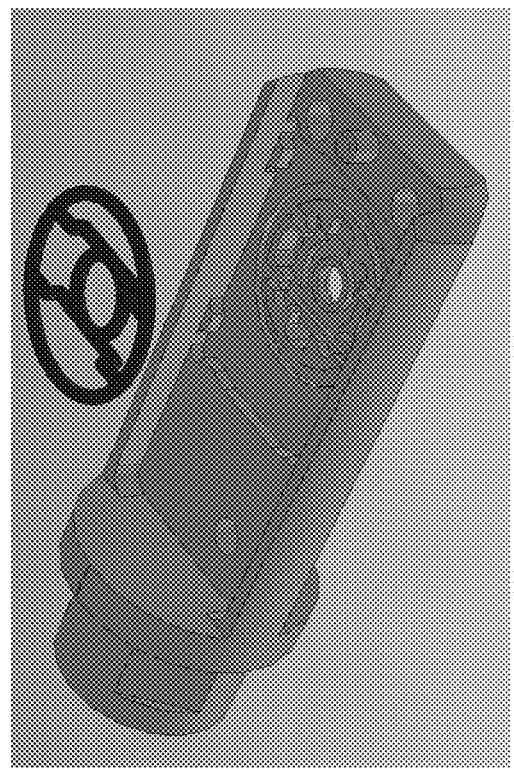
FIG. 14b is an exploded view of the sample holder with the flow directing gasket.
Figure 14A:
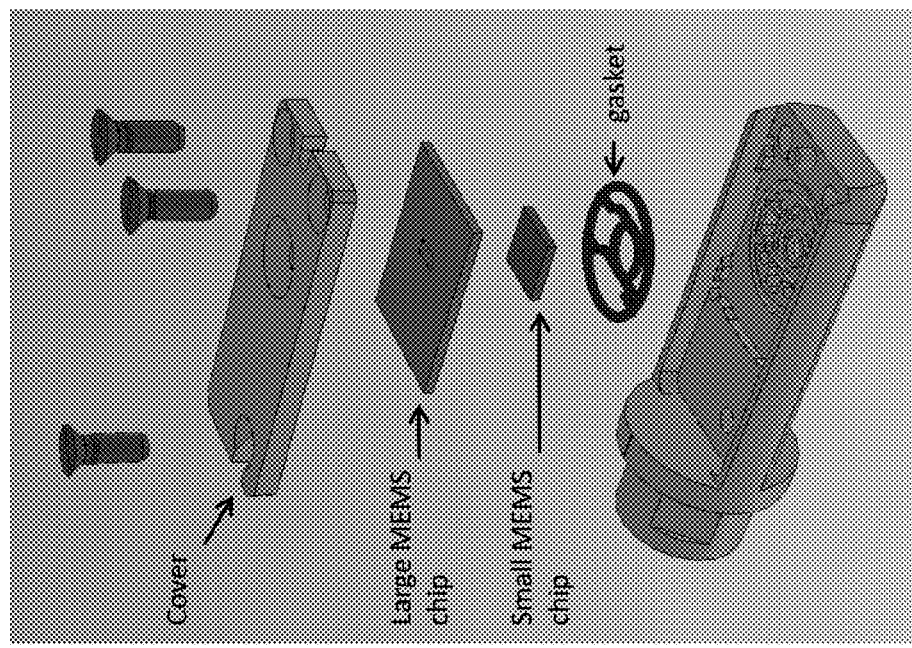
FIG. 14a illustrates the two port sample holder with the flow directing gasket as well as how the gasket and the MEMS chips are loaded into the sample holder.

FIGS. 14a and 14b shows an exploded view of the sample holder with the flow directing gasket described herein as well as how the gasket and the MEMS chips are loaded into the sample holder. The flow directing gasket can be customized based on the design of sample holder, the size and shape of the respective MEMS chips, and the sealing method (e.g., O-rings). Of note, the flow directing gasket is shown as a single, contiguous article having two gaskets in different planes and at least one arm member that connects the small gasket to the large gasket, wherein the at least one member maintains the two gaskets in different planes. In the case of the FIG. 14, four arm members are shown connecting the small gasket to the large gasket. It should be appreciated that only one member is needed to connect the large gasket and the small gasket (see, e.g., FIG. 16). Other embodiments of the flow directing gasket can be easily contemplated based on the position of the ports and the size and shape of the MEMS devices, as understood by the person skilled in the art. Regardless, the flow directing gasket will be compressed when the cover is attached to the body of the sample holder so as to prevent gases or liquids from escaping from between the holder body and the holder cover and to minimize the bypass of fluids around the MEMS chips, ensuring instead that the fluids substantially flow between the two MEMS chips. Both features are accomplished because the gasket comprises "steps" to transition from one plane to another, wherein the step is the shape of the edge of the small MEMS chip and wherein the riser of the steps is substantially the same height as the depth of the small MEMS chip such that upon compression, i.e., the cover affixed to the body of the sample holder, fluids will not substantially pass between the gasket and the edge of the MEMS chip (see, e.g., FIG. 12c). Moreover, the distance between the "step down" and the "step up" is the length of the small MEMS chip.

The cell holders and lids described herein are preferably titanium or brass and are died to guarantee very vertical and parallel pocket edges.

Figure 15D:
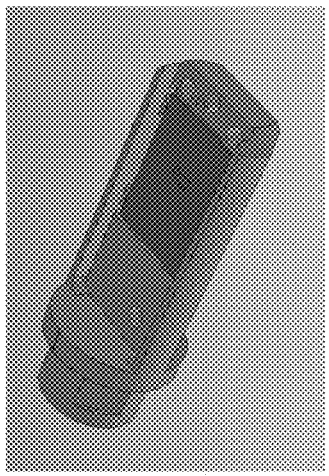
FIG. 15d illustrates the placement of the large MEMS chip in the FIG. 15c sample holder.
Figure 15E:
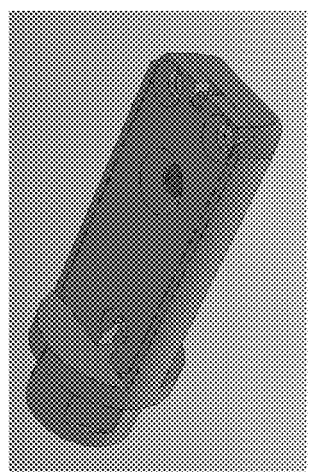
FIG. 15e illustrates the placement of the cover on the FIG. 15d sample holder.
Figure 15F:
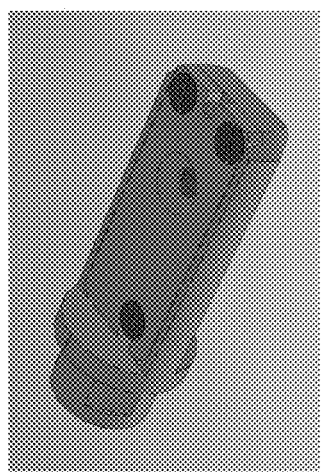
FIG. 15f illustrates the affixation of the cover.
Figure 15A:
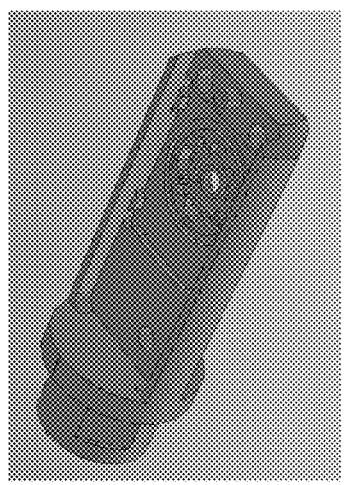
FIG. 15a illustrates the sample holder without a gasket of MEMS chips.
Figure 15B:
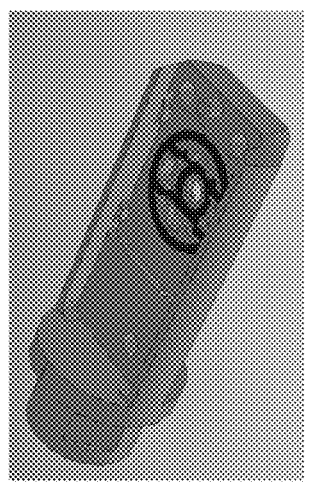
FIG. 15b illustrates the placement of the flow directing gasket in the FIG. 15a sample holder.
Figure 15C:
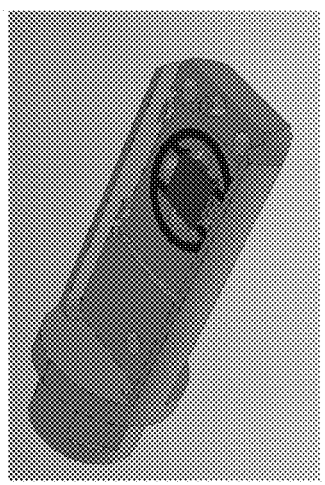
FIG. 15c illustrates the placement of the small MEMS chip in the FIG. 15b sample holder.
Figure 16E:
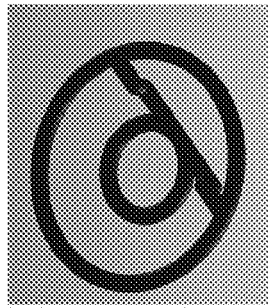
FIG. 16e illustrates the 3-dimensional image of the alternative flow directing gasket.
Figure 16C:
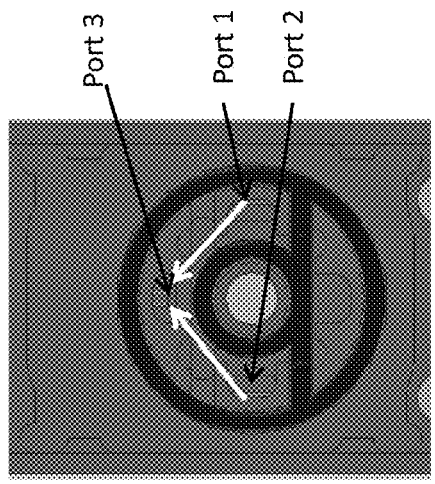
Figure 16D:
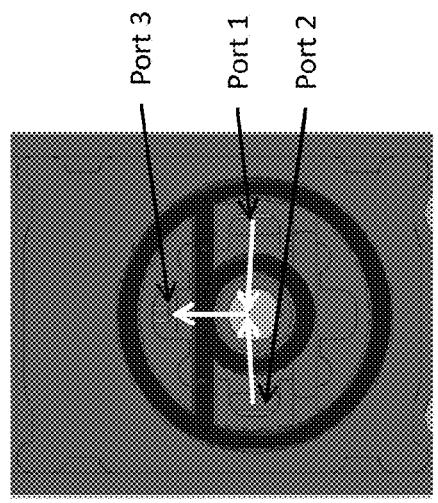
FIG. 16d illustrates the positioning of the gasket in the sample holder of FIG. 16b.
Figure 16A:
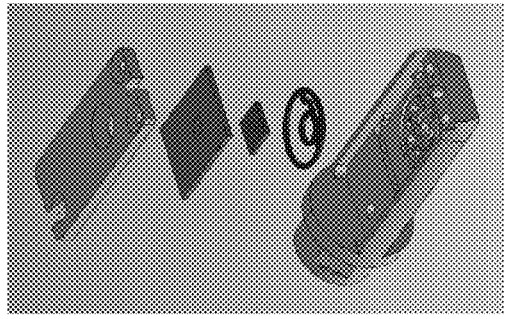
FIG. 16a illustrates the three port sample holder with the flow directing gasket as well as how the gasket and the MEMS chips are loaded into the sample holder.
Figure 16B:
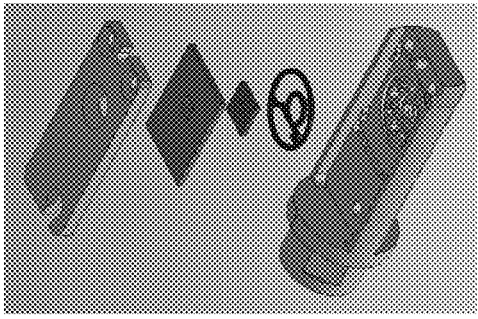
FIG. 16b illustrates another embodiment of the three port sample holder with the flow directing gasket as well as how the gasket and the MEMS chips are loaded into the sample holder.

FIGS. 15a-f display the loading of the flow directing gasket (FIG. 15b) and the two MEMS chips (FIGS. 15c and 15d) in the sample holder followed by the placement and affixation of the cover thereon (FIGS. 15e and 15f. During loading, the sample will be positioned between the membrane of the first loaded MEMS chip (e.g., the small MEMS chip) and the membrane of the second loaded MEMS chip (e.g., the large MEMS chip). The cover can be secured to the holder body using at least one screw (e.g., as shown in FIG. 15f or other fastening means.

FIG. 16 shows an alternative flow directing gasket design. This design has a gasket that can be configured to either bypass the membrane or to flow across it, depending on the assembly orientation. In FIGS. 16a and 16c, the gasket is positioned in a three port cell in an orientation that allows the majority of fluid to bypass the MEMS chip membranes. In FIGS. 16b and 16d, the gasket is positioned in the three port cell in an orientation that allows the fluid to flow across the MEMS chip membranes. FIG. 16e illustrates the 3-dimensional image of the alternative flow directing gasket.

Figure 17:
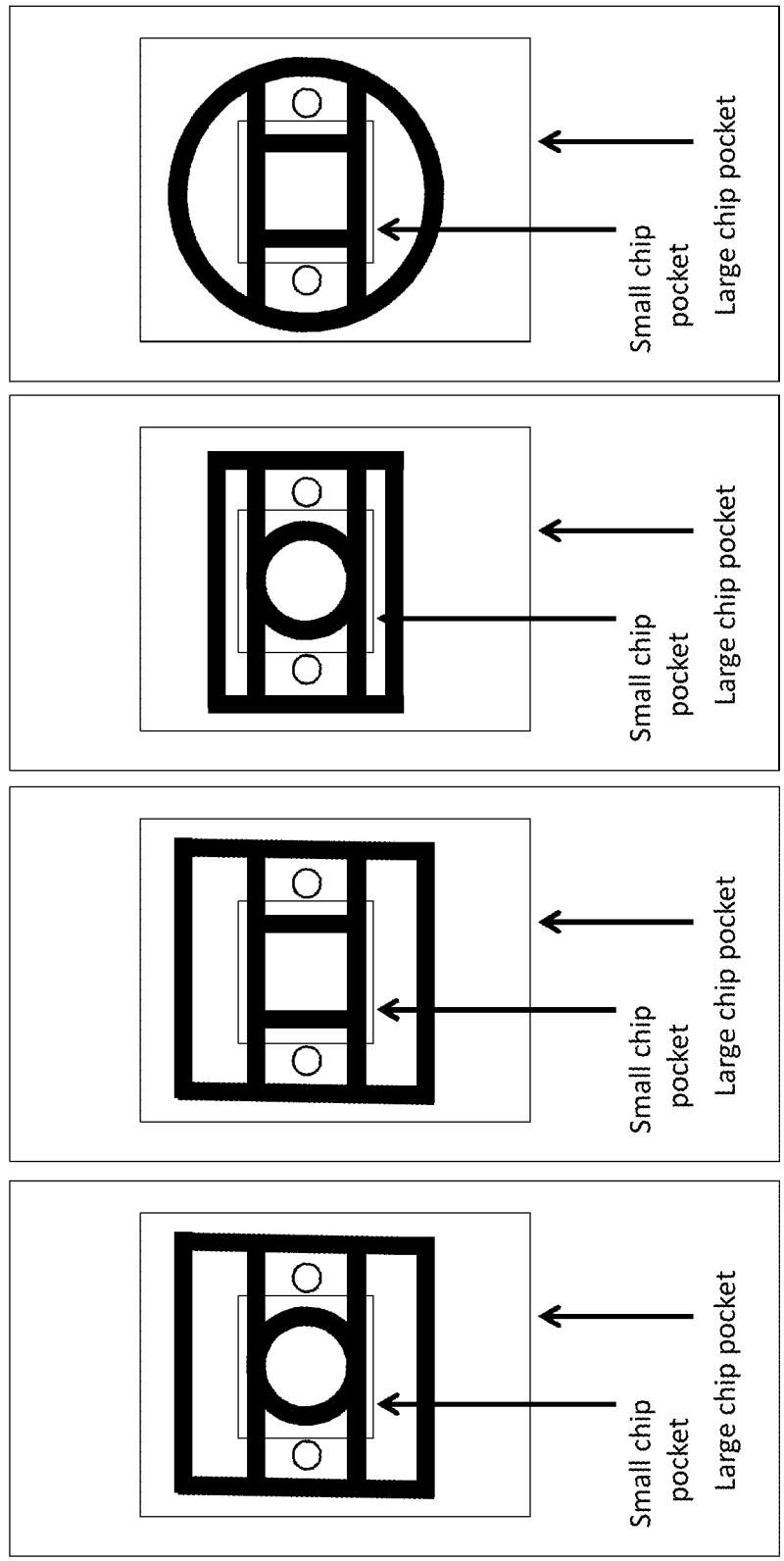
FIG. 17 illustrates alternative gasket shapes.
Figure 17:
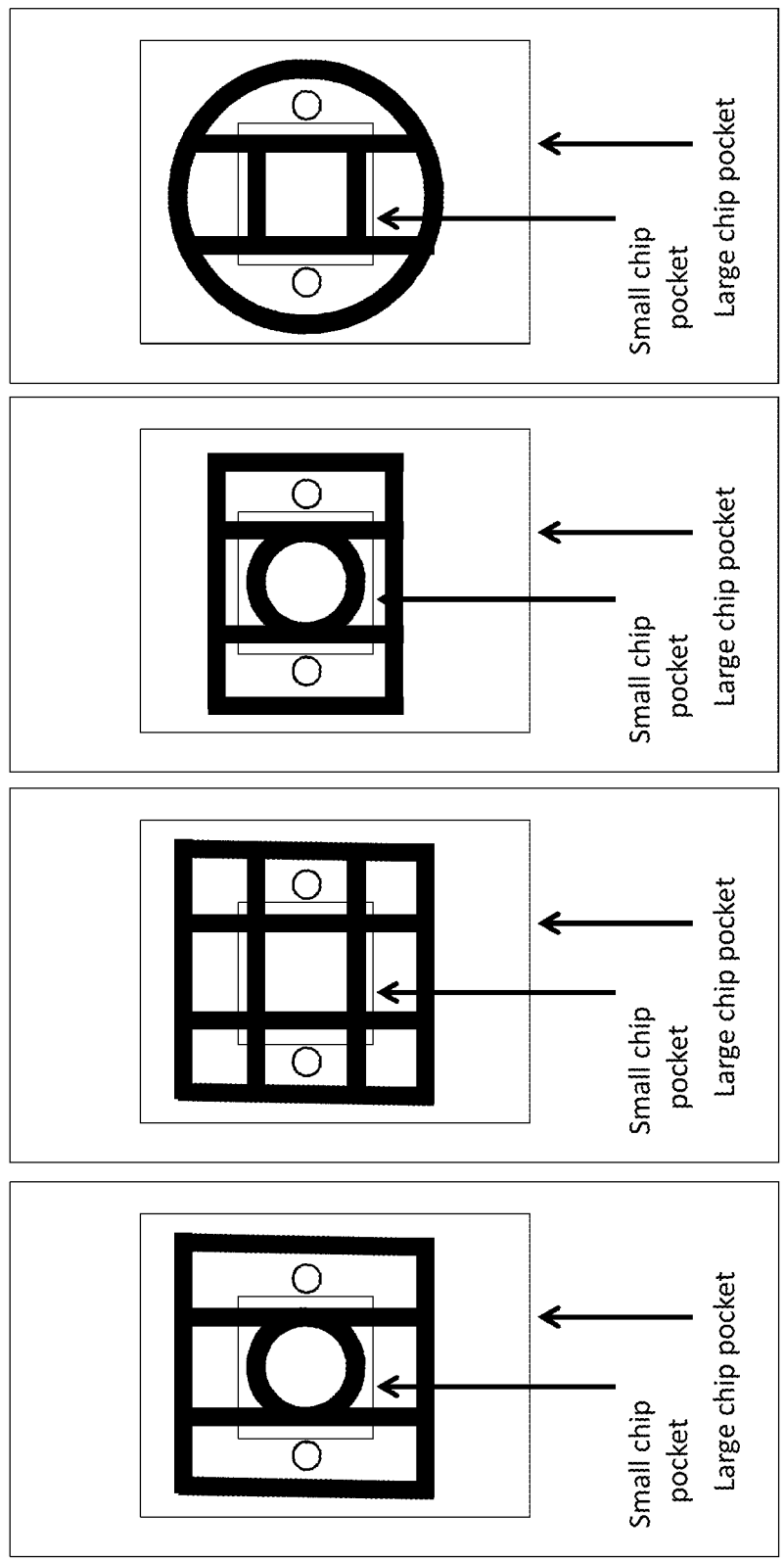

FIG. 17 illustrates alternative gasket shapes wherein the first gasket has a two-dimensional shape that is circular or square or rectangular and has a first enclosed area, and the second gasket has a two-dimensional shape that is circular or square or rectangular and has a second enclosed area, wherein the shape of the first gasket and the second gasket can be the same as or different from one another, and wherein the second enclosed area is smaller than the first enclosed area. It should be appreciated by the person skilled in the art that alternative gasket shapes to those shown are also contemplated. It can be seen that the arm members can be positioned in a variety of places to hold the first gasket and the second gasket together. In each case, the arm members serve to direct the fluid between the two MEMS chips.

Figure 18:
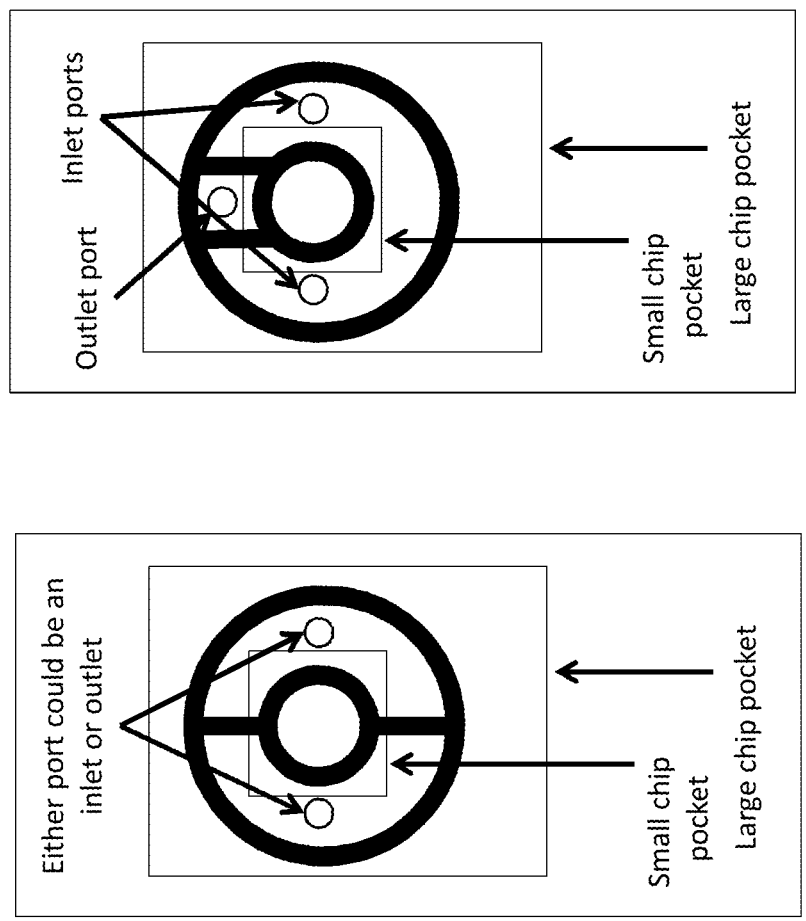
FIG. 18 illustrates the minimum number of arm members needed for a 2-port and a 3-port sample holder.

FIG. 18 illustrates the minimum number of arm members needed for a 2-port and a 3-port sample holder, wherein at least one arm member is positioned between an inlet port and an outlet port.

Another advantage of the arm member is to provide a holding force to the MEMS device. This can be seen most easily in FIGS. 12c, 13c and 15c. Gripping the edge of the MEMS device allows the device to be centered more accurately in the assembly and also prevents the device from coming loose from it's intended placement. In other words, the electron microscopy sample holder comprises a gasket that creates a seal between the primary planar surface of a MEMS device and a planar surface of the sample holder such that the holder has grooves that accept the perimeter of the gasket to fix the gasket position in the sample holder with arm members attached to the gasket that extend to one or more edges of the MEMS device to fix the MEMS device position in the sample holder. Though these figures show the arm members gripping the smaller of the two devices, a similar bracing feature would have the same benefit for the larger device (see, e.g., FIG. 19).

In practice, liquids or gases can be flowed in and out of the liquid, electrochemical or thermal environmental cells described herein through the supply lines without leaking to the outside environment. Electrical current and voltage can be supplied to the electrical or thermal device through the electrical supply lines. The holder can be placed in a TEM, the liquid, electrical or thermal device can be set to the desired current/voltage, and the type of liquid/liquids/gas/gases can be set applied to the sample using the supply lines. During imaging, the electron beam passes through the hole in the holder lid, strikes the sample on the heating membrane of the upper (window, thermal or electrical) device, passes through the window on the lower (window) device, then exits the gas cell through the hole on the bottom of the holder body.

The use of multiple inputs/outputs to the sample holder provides for the introduction of multiple reagents during use. This allows the user to image chemicals as they mix/react in real time within the environmental cell. It also improves time resolution since a chemical can be loaded, then released at a precise moment into the cell. For example, if a live cell is being imaged, the user can watch the live cell in flowing liquid, then introduce a fixative through a second input to instantaneously fix the cell. Alternatively, two different liquids can be input from either side of the liquid cell, react in the cell (between the windows), then released from a third port. It should be appreciated that the liquid cell, thermal cell, or electrochemical cell described herein can have one input and one output or any combination of multiple inputs/outputs as readily determined by the skilled artisan.

Accordingly, in another aspect, a method of imaging a sample in a liquid and/or gaseous environment in an electron microscope, said method comprising inserting a sample in a sample holder, inserting the sample holder comprising the sample in an electron microscope, introducing a liquid and/or gas to the sample in the sample holder, and imaging the sample in the electron microscope, wherein the sample holder comprises a sample holder body, a sample holder cover, and a gasket described herein.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:
1. A flow directing gasket comprising:
a first gasket having a first enclosed area, wherein the first gasket forms a seal on a first substantially planar surface;
a second gasket having a second enclosed area, wherein the second gasket forms a seal on a second substantially planar surface;
wherein the second enclosed area is smaller than the first enclosed area; and
at least one arm member that is attached to both the first and second gaskets, wherein the second gasket is on a plane that is different from that of the first gasket.

2. The gasket of claim 1, wherein the at least one arm member has a first and a second end, wherein the first end is attached to the first gasket and second end is attached to the second gasket.

3. The gasket of claim 1, wherein the gasket comprises two arm members.

4. The gasket of claim 1, wherein the gasket comprises three arm members.

5. The gasket of claim 1, wherein the gasket comprises four arm members.

6. The gasket of claim 1, wherein the second gasket is substantially centered relative to the first gasket.

7. The gasket of claim 1, wherein the second gasket is not substantially centered relative to the first gasket.

8. The gasket of claim 1, wherein the at least one member comprises a step from a first plane of the first gasket to a second plane of the second gasket.

9. The gasket of claim 8, wherein the step is shaped to form a seal at the edge of a MEMS chip such that fluid will not flow between the step and the edge of the MEMS chip.

10. The gasket of claim 8, wherein the step is shaped to provide a holding force to a first MEMS device.

11. The gasket of claim 8, wherein the step comprises a riser that has a height that is substantially similar to a depth of a MEMS chip.

12. The gasket of claim 1, wherein the first area defines a circle, a square or a rectangle.

13. The gasket of claim 1, wherein the second area defines a circle, a square or a rectangle.

14. The gasket of claim 1, wherein the first substantially planar surface comprises a MEMS device selected from the group consisting of a window device, an electrical device, and a thermal device.

15. The gasket of claim 1, wherein the second substantially planar surface comprises a MEMS device selected from the group consisting of a window device, an electrical device, and a thermal device.

16. The gasket of claim 1, wherein the first gasket comprises at least one brace to provide a holding force to a second MEMS device.

17. A sample holder for an electron microscope, said sample holder comprising a sample holder body, a sample holder cover, and a gasket of claim 1.

18. The sample holder of claim 17, further comprising at least one MEMS chip.

19. A method of imaging a sample in a liquid and/or gaseous environment in an electron microscope, said method comprising inserting a sample in a sample holder, inserting the sample holder comprising the sample in an electron microscope, introducing a liquid and/or gas to the sample in the sample holder, and imaging the sample in the electron microscope, wherein the sample holder comprises a sample holder of claim 17.

* * * * *